United States Patent
Kahara et al.

(10) Patent No.: US 10,663,320 B2
(45) Date of Patent: May 26, 2020

(54) MAGNETIC SENSOR DEVICE

(71) Applicant: Mitsubishi Electric Corporation, Chiyoda-ku (JP)

(72) Inventors: Hiroaki Kahara, Chiyoda-ku (JP); Masaaki Okada, Chiyoda-ku (JP); Tatsuya Kunieda, Chiyoda-ku (JP); Tomokazu Ogomi, Chiyoda-ku (JP); Hideki Matsui, Chiyoda-ku (JP); Sadaaki Yoshioka, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 16/333,095

(22) PCT Filed: Oct. 24, 2017

(86) PCT No.: PCT/JP2017/038318
§ 371 (c)(1),
(2) Date: Mar. 13, 2019

(87) PCT Pub. No.: WO2018/096862
PCT Pub. Date: May 31, 2018

(65) Prior Publication Data
US 2019/0360838 A1    Nov. 28, 2019

(30) Foreign Application Priority Data
Nov. 25, 2016   (JP) .................. 2016-229100

(51) Int. Cl.
*G01D 5/16* (2006.01)
*G07D 11/235* (2019.01)
(Continued)

(52) U.S. Cl.
CPC ........... *G01D 5/16* (2013.01); *G01R 33/0076* (2013.01); *G01R 33/091* (2013.01); *G07D 11/235* (2019.01)

(58) Field of Classification Search
CPC .... G01D 5/16; G07D 11/235; G01R 33/0076; G01R 33/091
(Continued)

(56) References Cited

U.S. PATENT DOCUMENTS

| 9,244,135 B2* | 1/2016 | Ogomi ................. G01R 33/096 |
| 2017/0153125 A1 | 6/2017 | Matsui et al. |
| 2017/0205474 A1* | 7/2017 | Ogomi ................. G01R 33/096 |
| 2018/0306873 A1 | 10/2018 | Matsui et al. |

FOREIGN PATENT DOCUMENTS

| EP | 1 258 841 A2 | 11/2002 |
| JP | 11-304896 A | 11/1999 |

(Continued)

OTHER PUBLICATIONS

International Search Report dated Jan. 23, 2018 in PCT/JP2017/038318 filed Oct. 24, 2017.
(Continued)

*Primary Examiner* — Reena Aurora
(74) *Attorney, Agent, or Firm* — Oblon, McClelland, Maier & Neustadt, L.L.P.

(57) ABSTRACT

A magnetic sensor device includes a magnet to form a magnetic field in a conveyance path of a detection target, a magnetoresistance effect element to output a change in the magnetic field as a change in a resistance value, a casing to enclose or hold the magnet and the magnetoresistance effect element, a cover to cover the magnetoresistance effect element and form a conveyance path surface that is a surface along the conveyance path, and a signal amplification board having a signal amplification IC disposed on an intersection surface that intersects the conveyance path surface. The
(Continued)

signal amplification IC amplifies the change in the resistance value that is output by the magnetoresistance effect element. The change in the resistance value depends on the change in the magnetic field caused due to conveyance of the detection target on the conveyance path surface.

20 Claims, 5 Drawing Sheets

(51) Int. Cl.
   *G01R 33/00* (2006.01)
   *G01R 33/09* (2006.01)
(58) Field of Classification Search
   USPC .......................................................... 324/260
   See application file for complete search history.

(56) References Cited

FOREIGN PATENT DOCUMENTS

| | | |
|---|---|---|
| JP | 11-316134 A | 11/1999 |
| JP | 2001-330471 A | 11/2001 |
| JP | 2003-35701 A | 2/2003 |
| JP | 2005-30872 A | 2/2005 |
| JP | 2009-3678 A | 1/2009 |
| WO | WO 2015/022864 A1 | 2/2015 |
| WO | WO 2015/194605 A1 | 12/2015 |
| WO | WO 2016/125634 A1 | 8/2016 |

OTHER PUBLICATIONS

Japanese Office Action dated Jun. 26, 2018 in corresponding Japanese Patent Application No. 2018-518526, (with English language translation).

\* cited by examiner

MAGNETIC SENSOR DEVICE

TECHNICAL FIELD

The present disclosure relates to a magnetic sensor device for detecting a magnetic pattern of a paper medium such as banknotes.

BACKGROUND ART

A known magnetic sensor device includes a magnetoresistance effect element and a signal amplification IC that are enclosed in a casing and mounted on a conveyance-path-side surface of a magnet. A cover for covering the magnetoresistance effect element and the signal amplification IC is provided on a conveyance path side of the casing to protect the magnetoresistance effect element and the signal amplification IC. That is, the magnetoresistance effect element and the signal amplification IC are disposed between the cover and the magnet, for example as in Patent Literature 1.

CITATION LIST

Patent Literature

Patent Literature 1: International Publication No. WO 2015/194605

SUMMARY OF INVENTION

Technical Problem

The known magnetic sensor device includes a banknote conveyance roller to convey banknotes, and the banknote conveyance roller is disposed on an opposite side of the conveyance path from the magnetic sensor device. The banknote passing through the banknote conveyance roller is pressed against the cover of the magnetic sensor device. Since the magnetoresistance effect element and the signal amplification IC are disposed between the cover and the magnet, the pressurized force of the banknote causes a change in pressure between the cover and the magnet. This change in pressure is applied to the signal amplification IC, which is a semiconductor element, and an electromotive force due to the piezoelectric effect occurs. The electromotive force and a signal output by the signal amplification IC are superimposed, thereby causing noise.

To address such circumstances, an objective of the present disclosure is to reduce noise in conveyance of banknotes and improve quality of an output signal of the magnetic sensor device.

Solution to Problem

A magnetic sensor device according to the present disclosure includes a magnet, a magnetoresistance effect element, a signal amplification IC, a casing, a cover, and a signal amplification board. The magnet forms a magnetic field in a conveyance path of a detection target. The magnetoresistance effect element outputs a change in the magnetic field as a change in a resistance value. The signal amplification IC is disposed along an intersection surface that intersects a conveyance path surface along the conveyance path, and amplifies the change in the resistance value that is output by the magnetoresistance effect element. The change in the resistance value depends on the change in the magnetic field caused due to conveyance of the detection target on the conveyance path surface. The casing encloses or holds the magnet and the magnetoresistance effect element. The cover covers one surface of the magnetoresistance effect element that faces the conveyance path, and the cover forms the conveyance path surface along the conveyance path. The signal amplification board has the signal amplification IC and is disposed along the intersection surface.

Advantageous Effects of Invention

According to the present disclosure, arranging the signal amplification IC along the intersection surface that intersects the conveyance path surface can reduce noise resulting from an electromotive force due to a piezoelectric effect in conveyance of the detection target and improve quality of the output signal of the magnetic sensor device.

DESCRIPTION OF EMBODIMENTS

Figure 1:
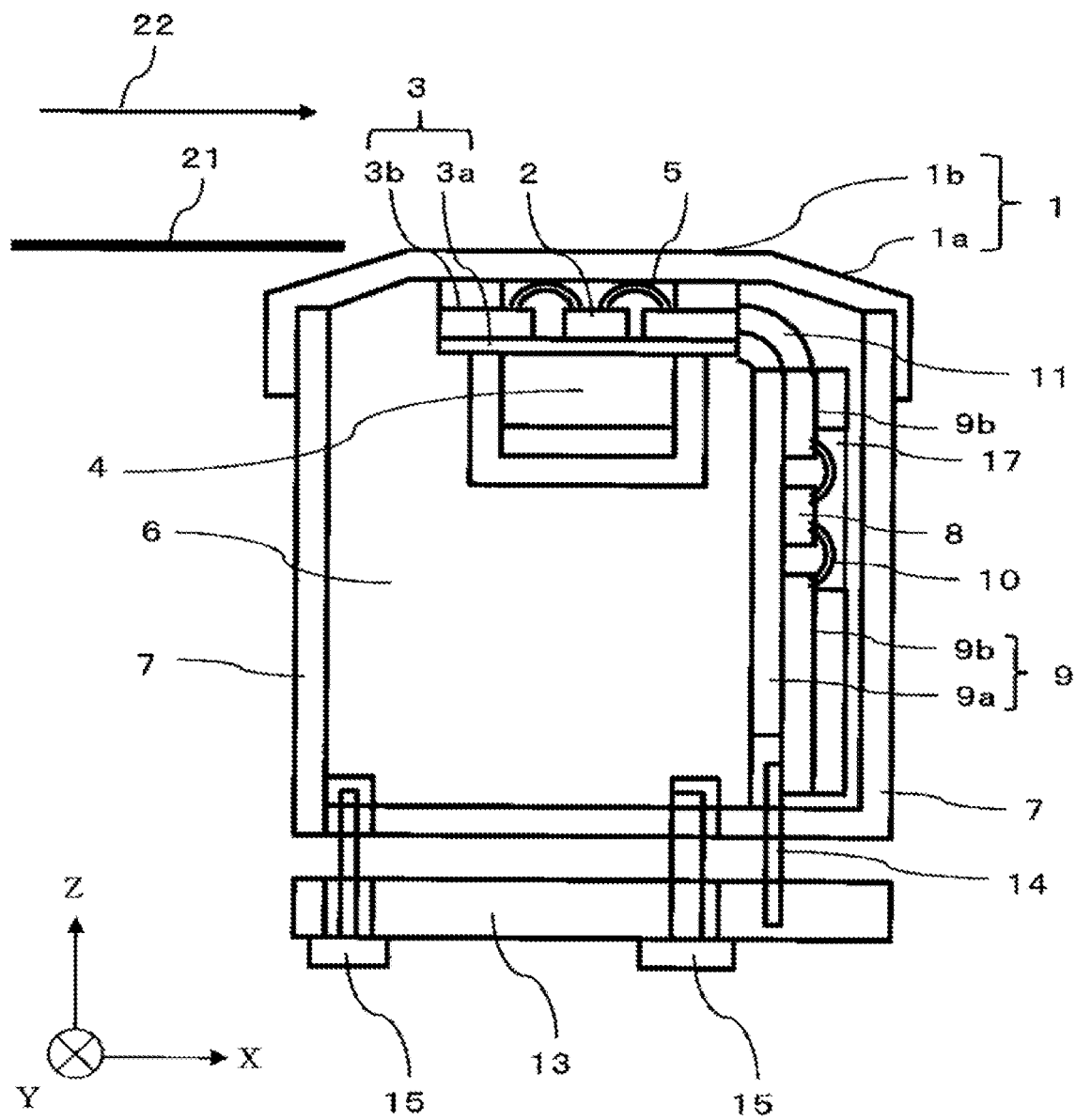
FIG. 1 is a cross-sectional view, taken along an XZ plane, of a magnetic sensor device according to an embodiment of the present disclosure.

Embodiments of the present disclosure are described with reference to the drawings. The same reference signs are used to refer to the same or like parts throughout the drawings. The reference signs X, Y, and Z in the drawings represent three axes. The reference sign X represents an X axis indicating a conveyance direction 22 of a magnetic sensor device. The conveyance direction 22 is a direction in which a detection target 21 is conveyed on the magnetic sensor device and corresponds to a transverse direction of the magnetic sensor device. The reference sign Y represents a Y axis perpendicular to the X axis and corresponds to a scan-width direction of the magnetic sensor device as well as a longitudinal direction of the magnetic sensor device. The reference sign Z represents a Z axis perpendicular to the X axis and the Y axis and corresponds to a direction of a height of the magnetic sensor device. The origin of the X axis is at the center of the width of the magnetic sensor device in the conveyance direction 22, the origin of the Y axis is at the center of the length of the magnetic sensor device in the scan-width direction, and the origin of the Z axis is in a plane of the magnetic sensor device on which the detection target 21 is conveyed.

In all the embodiments of the present disclosure, the phrase "the conveyance of the detection target 21" includes the conveyance of the detection target 21 itself and movement of the magnetic sensor device itself in the conveyance direction 22 without movement of the detection target 21. The conveyance direction 22 includes not only a positive direction of the X axis but also a negative direction of the X axis. The place where the detection target 21 is conveyed in the conveyance direction 22 is referred to as a conveyance path.

Figure 2:
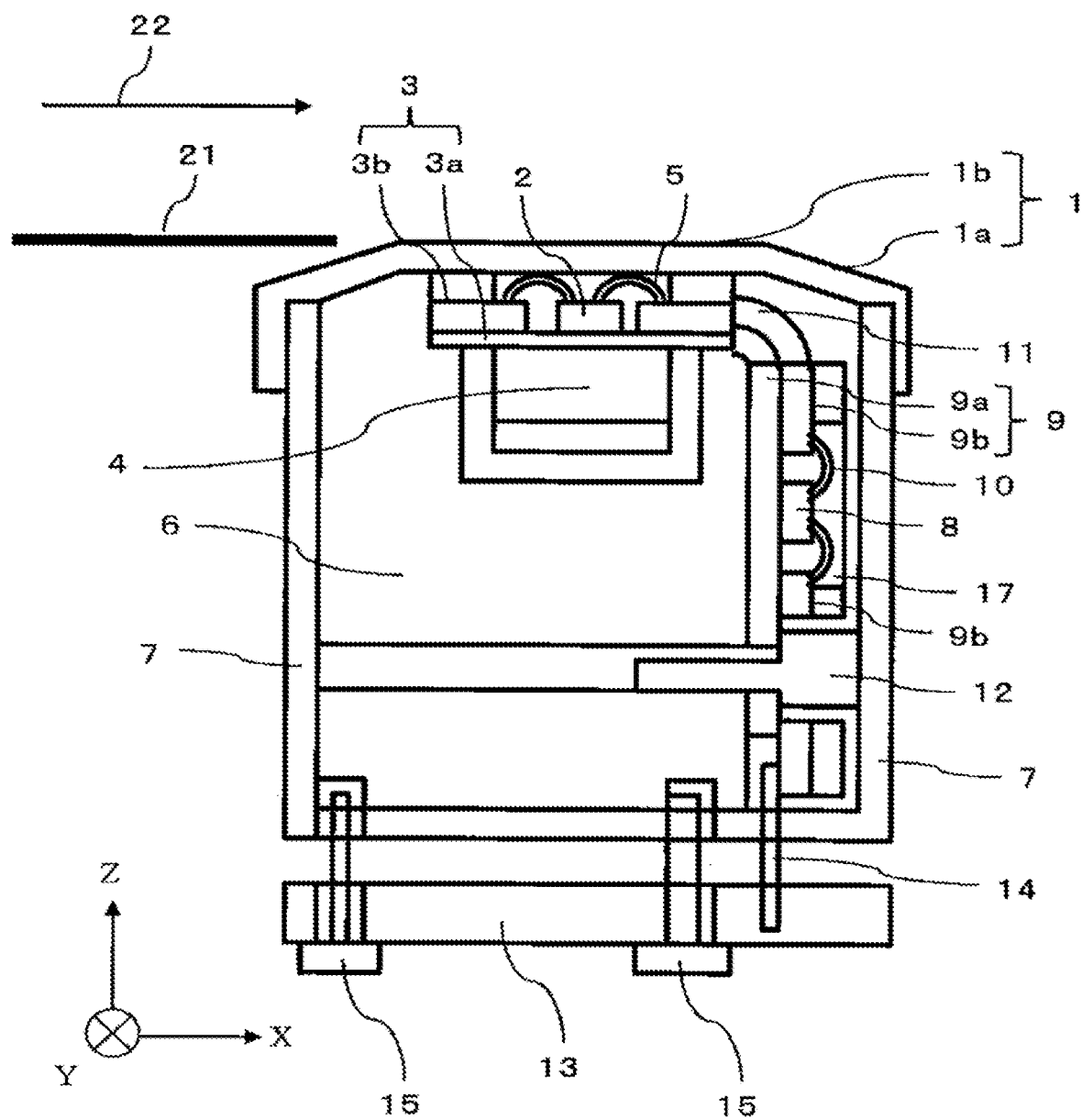
FIG. 2 is a cross-sectional view, taken along the XZ plane in which the magnetic sensor device includes a screw, of the magnetic sensor device according to the embodiment.
Figure 3:
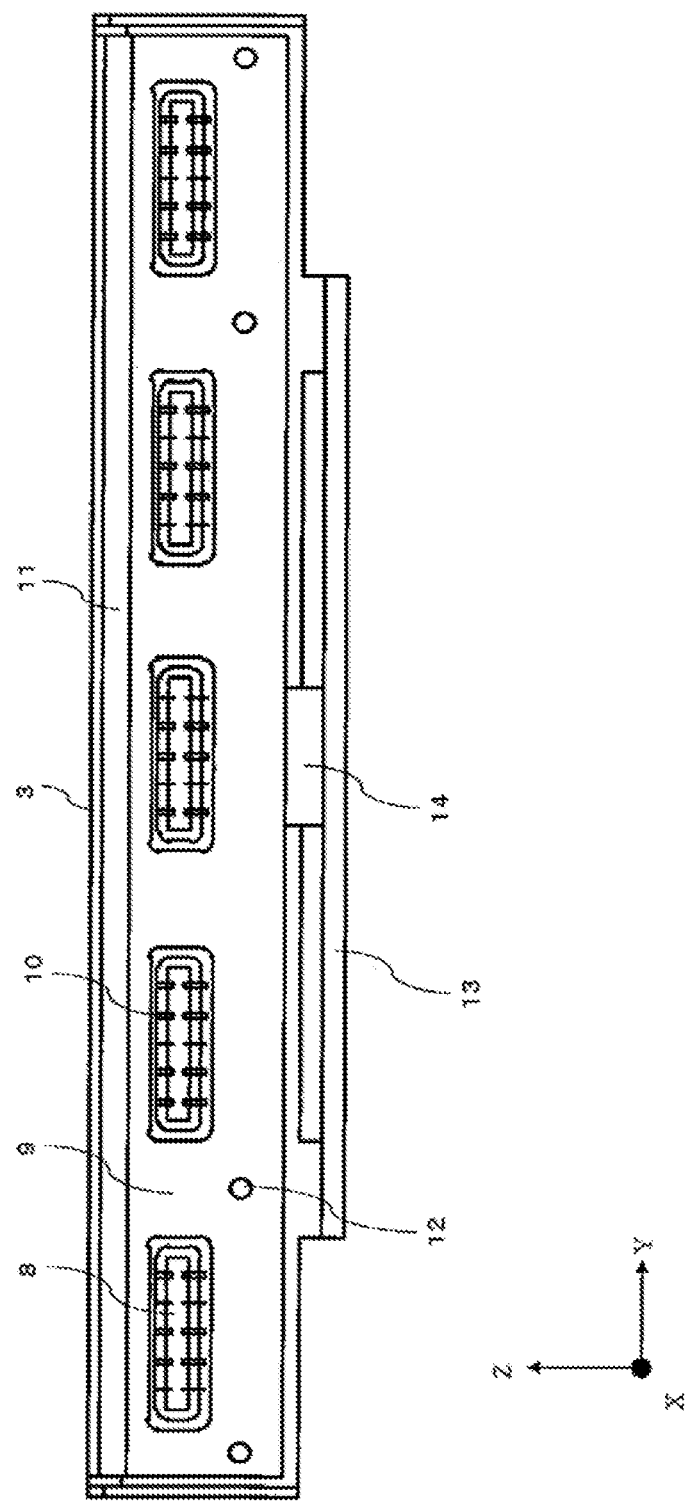
FIG. 3 is a YZ-plane side view of the magnetic sensor device according to the embodiment, with a cover and a magnetic shield thereof removed.
Figure 4:
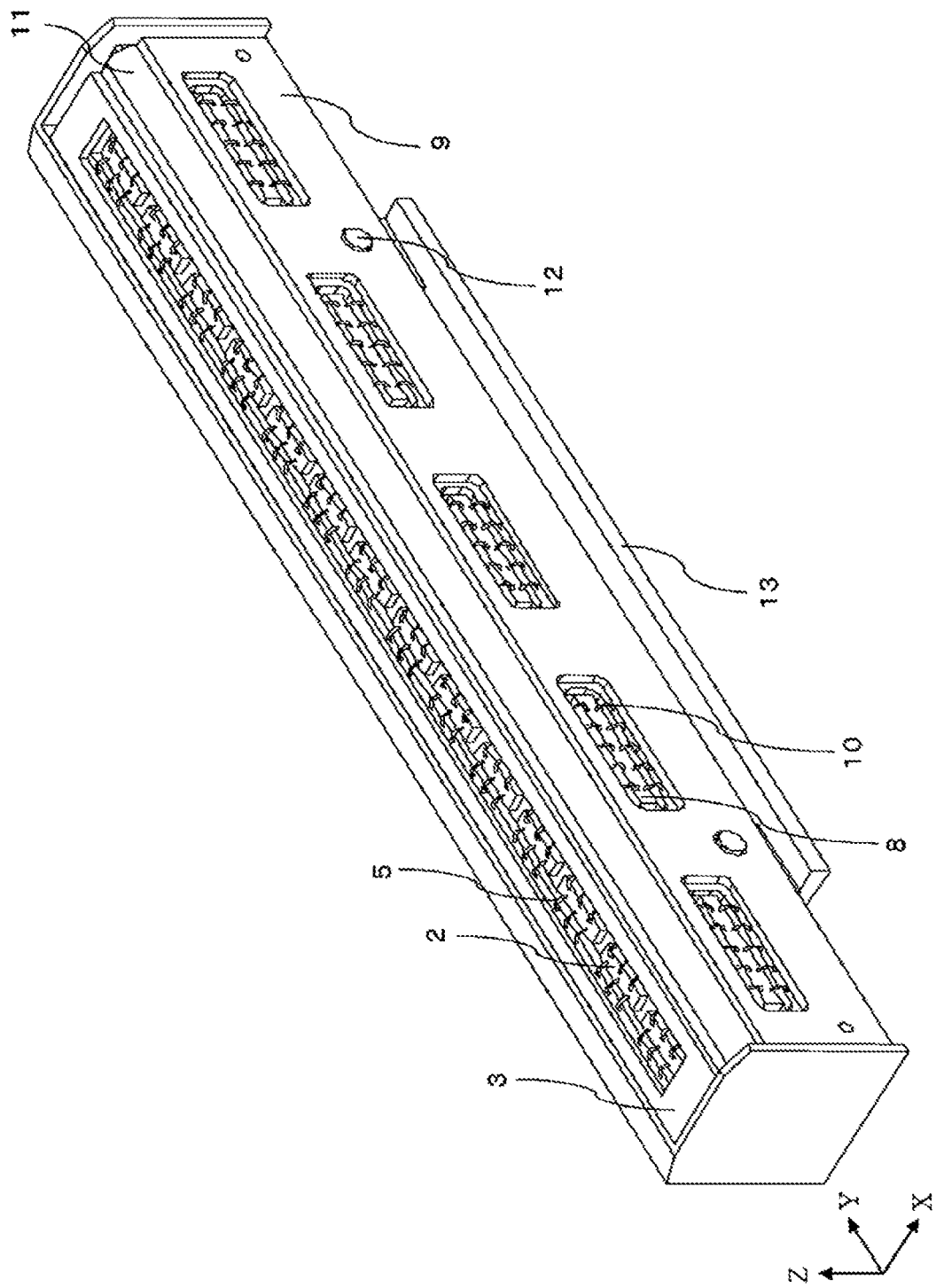
FIG. 4 is a perspective view, as viewed from a magnetoresistance effect element side and a signal amplification IC side, of the magnetic sensor device according to the embodiment, with the cover and the magnetic shield thereof removed.

A configuration of the magnetic sensor device according to an embodiment is described with reference to FIGS. 1 to 4. FIG. 1 is a cross-sectional view, taken along an XZ plane, of the magnetic sensor device according to the embodiment of the present disclosure. FIG. 2 is a cross-sectional view, taken along the XZ plane in which the magnetic sensor device includes a screw, of the magnetic sensor device according to the embodiment. FIG. 3 is a YZ plane side view of the magnetic sensor device according to the embodiment, with a cover and a magnetic shield thereof removed. FIG. 4 is a perspective view, as viewed from a magnetoresistance effect element side and a signal amplification IC side, of the magnetic sensor device according to the embodiment, with the cover and the magnetic shield thereof removed.

Components of the magnetic sensor device according to the embodiment are described in detail with reference to FIGS. 1 to 4. The cover 1 is a member that forms a conveyance path surface, for conveyance of the detection target 21, of the magnetic sensor device. The cover 1 extends in the Y-axis direction as the conveyance path surface of the magnetic sensor device, and covers, among sides of a casing 6 intersecting the Z-axis direction, a side of the casing 6 at which a magnetoresistance effect element 2 is disposed. The casing 6 encloses or holds a permanent magnet 4 and the magnetoresistance effect element 2 in orientations such that one surface of the permanent magnet 4 and one surface of the magnetoresistance effect element 2 face the conveyance path. The cover 1 covers at least the one surface of the magnetoresistance effect element 2 that faces the conveyance path. That is, the cover 1 covers a conveyance path side of the casing 6. The casing 6 has a box-like shape with an opening located on the conveyance path side in the Z-axis direction. The casing 6 has the opening for use of enclosing or holding components of the magnetic sensor device, and a hole for positioning and a mounting surface.

A sensor board 3 exists between the cover 1 and the permanent magnet 4 in the Z-axis direction, and extends in the Y-axis direction. The magnetoresistance effect element 2 is mounted on a positive-Z-axis-side surface of the sensor board 3. This surface is opposite to a surface of the sensor board 3 facing the permanent magnet 4. That is, the magnetoresistance effect element 2 is mounted on a conveyance-path-side surface of the sensor board 3. For example, the sensor board 3 has a carrier 3a and a dielectric board 3b that is a glass epoxy board provided on the conveyance path side of the carrier 3a.

As illustrated in FIGS. 1 and 2, the magnetoresistance effect element 2 is secured, for example, by adhesive, on the conveyance-path-side surface of the carrier 3a included in the sensor board 3. The X and Y positions of the magnetoresistance effect element 2 on the sensor board 3 differ as may be required in accordance with a location of a detection part of the magnetic sensor device.

The magnetoresistance effect element 2 detects a change in a conveyance-direction 22 component of a magnetic field that occurs due to the detection target 21 including magnetic components being conveyed in the conveyance direction 22. A resistance value of the magnetoresistance effect element 2 changes, and the magnetoresistance effect element 2 thereby detects the magnetic component of the detection target 21 and outputs the detected magnetic component as a detection signal that is an electrical signal.

A wiring pattern formed on the dielectric board 3b of the sensor board 3 is electrically connected to the magnetoresistance effect element 2 via a metal wire 5 such as a gold wire and an aluminum wire. The sensor board 3 has an external connection for external output of the electrical signal of the magnetoresistance effect element 2.

The casing 6 is in contact with a portion of a surface of the carrier 3a that faces the permanent magnet 4, that is, a portion of the surface of the carrier 3a that is located on the negative-Z-axis side and opposite to the conveyance path side. The portion of the surface of the carrier 3a with which the casing 6 is in contact is secured to the casing 6, for example by adhesive, thereby achieving fixing of the sensor board 3 to the casing 6.

The permanent magnet 4 has a rod-like shape extending in the Y-axis direction. The permanent magnet 4 is fixed, for example by adhesive, to a surface of the sensor board 3 that is opposite to the surface thereof on which the magnetoresistance effect element 2 is mounted. That is, the permanent magnet 4 is fixed, for example by adhesive, to a negative-Z-axis-side surface of carrier 3a included in the sensor board 3.

The position of the permanent magnet 4 in the Z-axis direction is determined such that the permanent magnet 4 is disposed in parallel to the magnetoresistance effect element 2 and in contact with the surface of the sensor board 3 that is opposite to the surface thereof on which the magnetoresistance effect element 2 is mounted. The position of the permanent magnet 4 in the X-axis direction can be taken as corresponding to the X-axis-direction center of the magnetoresistance effect element 2.

A single permanent magnet 4 may extend in the Y-axis direction or multiple permanent magnets 4 may extend as segments in the Y-axis direction.

The permanent magnet 4 forms a magnetic field and applies a bias magnetic field to the magnetoresistance effect element 2. The detection target 21 is conveyed through the magnetic field formed by the permanent magnet 4 in the conveyance path, thereby causing a change in the magnitude of the bias magnetic field. The change in the bias magnetic field causes a change in a resistance value of the magnetoresistance effect element 2, and a detection signal is output by the magnetoresistance effect element 2.

As illustrated in FIGS. 1 and 2, the cover 1 covers, among sides of the casing 6 that are perpendicular to the Z-axis direction, a side at which the magnetoresistance effect element 2 is disposed. That is, the cover 1 covers the surface of the sensor board 3 on which the magnetoresistance effect element 2 is mounted.

As illustrated in FIGS. 1 and 2, the cover 1 has a conveyance path surface 1b and a pair of tapers 1a. When the magnetic sensor device is viewed in the Y-axis direction, the conveyance path surface 1b is a surface formed along the X-axis direction, and the pair of tapers 1a inclines in the negative Z-axis direction from both of the X-axis-direction end portions of the conveyance path surface 1b. The pair of tapers 1a and the conveyance path surface 1b extend in the Y-axis direction.

The conveyance path surface 1b and the pair of tapers 1a of the cover 1 are integrally formed by bending of a metal thin plate. The cover 1 is attached to the conveyance-path-side surface of the casing 6. Since the cover 1 has the tapers 1a that serve as a conveyance guide, the detection target 21 moves along the tapers 1a during the conveyance, which has the effect of preventing the detection target 21 from moving in a direction other than the X-axis direction.

The cover 1 protects the magnetic sensor device, particularly the magnetoresistance effect element 2, against impact or abrasion due to striking or wearing occurring when the detection target 21 is conveyed on the magnetic sensor device. The cover 1 is located between the detection target 21 and the magnetoresistance effect element 2. Thus the cover 1 is desirably made of a non-magnetic material to reduce effects on magnetic sensitivity of the magnetic sensor device.

In the example above, the cover 1 is made by bending of the metal thin plate, but any material and manufacturing method may be adopted as long as the magnetic sensor device can be protected.

As illustrated in FIGS. 1 and 2, the casing 6 is a member for enclosing or holding therein the sensor board 3, the permanent magnet 4, and the like that are components other than the cover 1, a magnetic shield 7, a signal amplification board 9, and a signal processing board 13. The casing 6 is formed by metal such as aluminum, electrically conductive materials such as electrically conductive resin, or the like. The casing 6 has a hole for positioning the sensor board 3 in the X-axis direction and the Y-axis direction. The hole is formed by recession, in the negative-Z-axis direction, of a surface of the casing 6 to which the cover 1 is attached.

To reduce the effects on the magnetic field, the casing 6 is desirably made of a non-magnetic material, for example, aluminum.

In this embodiment, the casing 6 is formed by machining aluminum. Any material can be used for the casing 6 as long as the casing 6 can enclose or hold therein the sensor board 3, the permanent magnet 4, and the like, and the casing 6 may be made of a non-electrically conductive resin.

The signal amplification board 9 is disposed on a side surface of the casing 6 perpendicular to the X-axis direction, that is, an intersection surface 6a of the casing 6 that intersects the conveyance path surface 1b of the cover 1. The intersection surface 6a intersects the conveyance-path-side surface of the casing 6. The signal amplification board 9 is spaced apart from the conveyance path. The intersection surface 6a is an outer surface of the casing 6 that intersects the conveyance path surface 1b. The two surfaces that intersect with each other do not need to be in contact with each other, and may be two surfaces having a positional relationship so that if either one of the surfaces extends, the one is in contact with the other and intersects the other. For example, the signal amplification board 9 has a carrier 9a and a dielectric board 9b, and the dielectric board 9b is a glass epoxy board provided on a surface of the carrier 9a that is opposite to the surface thereof facing the casing 6.

The signal amplification board 9 is fixed to the casing 6 by screw 12. The signal amplification board 9 is fixed to the casing 6 such that the signal amplification board 9 is pressed against the casing 6 by the screw 12 in an orientation such that a screw head of the screw 12 is located on a side of the signal amplification board 9 on which a signal amplification IC 8 is mounted. As in the XZ-plane view, the signal amplification board 9 attached to the casing 6 is positioned with respect to the conveyance path surface 1b of the cover 1 so as to intersect the conveyance path surface 1b at 90 degrees.

Figure 5:
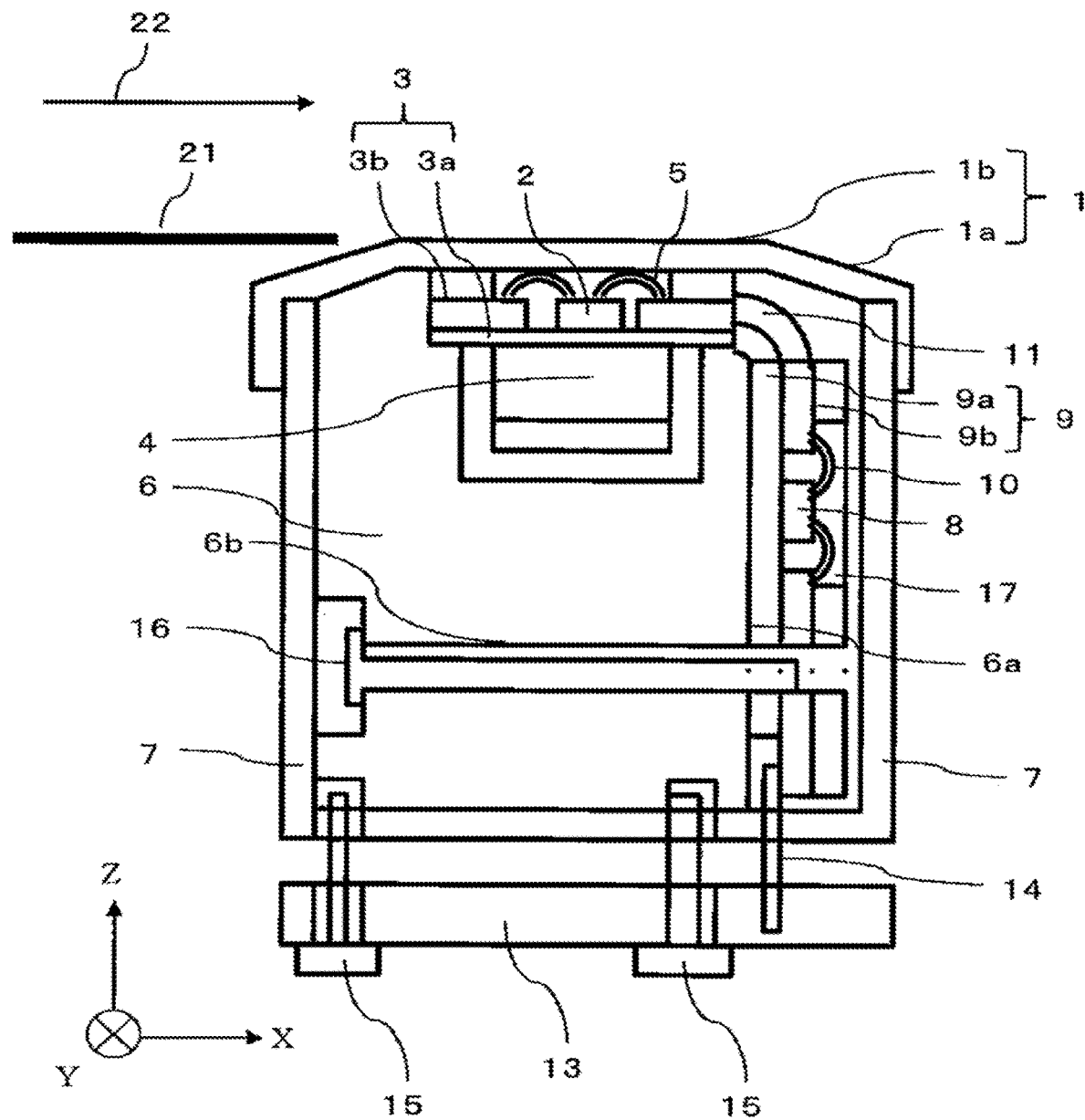
FIG. 5 is a cross-sectional view, taken along the XZ plane in which the magnetic sensor device includes a screw, of the magnetic sensor device according to the embodiment.

As illustrated in FIG. 5, the signal amplification board 9 may be fixed to the casing 6 in a forced manner toward the casing 6 by passing a screw thread of a screw 16 into a through-hole 6b bored through the casing 6 in an orientation such that a screw head of the screw 16 is located on a surface of the casing 6 that is opposite to the intersection surface 6a.

The signal amplification IC 8 for amplification of the detection signal output by the magnetoresistance effect element 2 is mounted on the signal amplification board 9. The signal amplification IC 8 is formed of a semiconductor element made of, for example, silicon. The signal amplification IC 8 is secured, for example by adhesive, on a surface of the carrier 9a included in the signal amplification board 9, opposite to a surface thereof facing the casing 6. The signal amplification IC 8 is connected to a wiring pattern formed on the dielectric board 9b included in the signal amplification board 9 via a metal wire 10 such as a gold wire and an aluminum wire. A molding 17, resulting from mold filling with, for example, silicone resin over the signal amplification IC 8 and wires 10, protects the signal amplification IC 8 and the wires 10 against foreign objects.

A flex board 11, for example, a flexible board is provided on an end portion of the signal amplification board 9 on a cover 1 side thereof, that is, on the positive-Z-axis-side end portion of the signal amplification board 9. The flex board 11 is connected to the sensor board 3, and receives the detection signal output from the magnetoresistance effect element 2 and provides the detection signal to the signal amplification board 9. The method for connecting the sensor board 3 to the signal amplification board 9 is not limited to use of the flex board 11, and may be, for example, component connection by use of a connector or the like.

A connection line 14 is provided on a side of the signal amplification board 9 that is opposite to the cover 1 side thereof, that is to say, on the negative-Z-axis-direction side of the signal amplification board 9. The connection line 14 is connected to the signal amplification board 13, and receives the detection signal output from the magnetoresistance effect element 2 and then amplified by the signal amplification IC 8 and provides the detection signal to the signal processing board 13. The method for connecting the signal amplification board 9 to the signal processing board 13 is not limited to use of the connection line 14, and may be, for example, component connection by use of a connector.

The sensor board 3, the signal amplification board 9, and the flex board 11 may be integrally formed using a rigid flexible board. The signal amplification board 9, the connection line 14, and the signal processing board 13 may also be integrally formed using a rigid flexible board. The sensor board 3, the flex board 11, the signal amplification board 9, the connection line 14, and the signal processing board 13 may also be integrally formed using a rigid flexible board.

The signal processing board 13 is fixed to the casing 6 by a screw 15 on the surface that is opposite to the conveyance-path-side surface of the casing 6.

The signal processing board 13 processes the detection signal received from the signal amplification board 9, and outputs the detection signal as parallel signals or a serial signal.

As illustrated in FIGS. 1 and 2, the magnetic shield 7 has, when the magnetic sensor device is viewed in the Y-axis direction, a bottom formed along the X-axis direction and a pair of side walls mounted on the bottom uprightly in the positive-Z-axis direction and spaced in the X-axis direction. The pair of side walls and the bottom extend in the Y-axis direction. That is, the magnetic shield 7 is shaped to have an opening on a side that is opposite to the bottom in the Z-axis direction. The magnetic shield 7 desirably has a Y-axis-direction length that is equal to or longer than Y-axis-direction lengths of at least the permanent magnet 4 and the sensor board 3.

The casing 6 and the signal amplification board 9 fastened to the casing 6 are disposed in a space enclosed by the bottom and the pair of side walls of the magnetic shield 7, that is, in an interior of the magnetic shield 7. That is, the casing 6 is covered by the magnetic shield 7 except for a side surface thereof on which the sensor board 3 is fixed. In other words, the sides of the casing 6 except for the conveyance path surface 1b side are covered by the magnetic shield 7. Thus the signal amplification board 9 is disposed between the casing 6 and the magnetic shield 7.

The magnetic shield 7 is fixed to the casing 6 by fastening with a fastener member or by securing, for example with an adhesive. The bottom and the pair of side walls of the magnetic shield 7 may be separately formed and joined by an adhesive, or integrally formed by bending of a metal thin plate or extrusion processing of a block material.

The screw head of the screw 12 for fixing the signal amplification board 9 to the casing 6 abuts the surface of the magnetic shield 7 that faces the signal amplification board 9, thereby ensuring a space between the magnetic shield 7 and the signal amplification board 9. The height of the screw head of the screw 12 is higher than a height of a loop of the wire 10. The screw head of the screw 12 serves as a spacer, which prevents the signal amplification IC 8 and the wire 10 from being in contact with the magnetic shield 7 and thereby being damaged. In addition, contact between the molding 17 and the magnetic shield 7 is avoided, thereby preventing application of pressure onto the signal amplification IC 8.

A resin block, a shim plate, or the like may be inserted, as a spacer, between the signal amplification board 9 and the magnetic shield 7. The dielectric board included in the signal amplification board 9 may have a height that is greater than the loop height of the wire 10, and may be in contact with the magnetic shield 7.

Behavior of the magnetic sensor device during conveyance of the detection target 21 in this embodiment is described below.

Upon conveyance, the detection target 21 is in contact with the cover 1. The detection target 21 that is in contact with the cover 1 is guided along the taper 1a to the conveyance path surface 1b. The magnetoresistance effect element 2 mounted on the conveyance path side surface of the permanent magnet 4 is disposed on the casing 6 side of the conveyance path surface 1b. That is, the magnetoresistance effect element 2 is disposed in a space sandwiched between the conveyance path surface 1b and the permanent magnet 4.

As the detection target 21 is guided to the conveyance path surface 1b, the detection target 21 comes into contact with the conveyance path surface 1b, which causes, on the conveyance path surface 1b, the occurrence of a pressurized force that is minute but may cause the conveyance path surface 1b to deform in the negative-Z-axis direction.

In the case of the magnetic sensor device disclosed in Patent Literature 1, the magnetoresistance effect element and the signal amplification IC are disposed in a space sandwiched between the conveyance path surface and the permanent magnet. In this magnetic sensor device, when the magnetoresistance effect element and the signal amplification IC are, for example, mold-filled with a silicone resin, and the silicone resin is in contact with the conveyance path surface, a pressurized force is applied to the silicone resin. Thus the signal amplification IC formed of a semiconductor element experiences a change in pressure of the silicone resin, and an electromotive force due to the piezoelectric effect occurs in the signal amplification IC.

In contrast, in the magnetic sensor device according to the present embodiment, the signal amplification board 9 with the signal amplification IC 8 mounted thereon is not disposed in the space sandwiched between the conveyance path surface 1b and the permanent magnet 4. The signal amplification board 9 is fixed on one of side surfaces of the casing 6 that face each other in the X-axis direction, that is, the intersection surface 6a that intersects the conveyance path surface 1b of the cover 1 disposed on the casing 6. Thus the signal amplification IC 8 is not affected by a change in pressure of the space sandwiched between the conveyance path surface 1b and the permanent magnet 4. Thus the conveyance of the detection target 21 does not result in occurrence of the piezoelectric effect, and noise resulting from the electromotive force due to the piezoelectric effect is not superimposed on the detection signal output by the signal amplification IC 8. Thus good quality detection signals can be obtained.

The above embodiment provides an example in which the signal amplification board 9 is disposed on the intersection surface 6a that intersects the conveyance-path-side surface of the casing 6. However, the similar effects can be obtained with a configuration in which the signal amplification board 9 is disposed on a surface of the casing 6 that faces the intersection surface 6a of the casing 6, that is, a back side of the casing 6 that can be referred to when the intersection surface 6a is taken as a front side of the casing 6.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2016-229100, filed on Nov. 25, 2016, the entire disclosure of which is incorporated by reference herein.

REFERENCE SIGNS LIST

1 Cover
1a Taper
1b Conveyance path surface
2 Magnetoresistance effect element
3 Sensor board
3a Carrier
3b Dielectric board
4 Permanent magnet
5 Wire
6 Casing
6a Intersection surface
6b Through-hole
7 Magnetic shield
8 Signal amplification IC
9 Signal amplification board
9a Carrier
9b Dielectric board
10 Wire
11 Flex board
12 Screw
13 Signal processing board
14 Connection line 15, 16 Screw
17 Molding
21 Detection target
22 Conveyance direction

The invention claimed is:

1. A magnetic sensor device, comprising:
a magnet to form a magnetic field in a conveyance path of a detection target;
a magnetoresistance effect element to output a change in the magnetic field as a change in a resistance value;
a signal amplification IC disposed along an intersection surface that intersects a conveyance path surface parallel to the conveyance path, the signal amplification IC amplifying the change in the resistance value that is output by the magnetoresistance effect element, the change in the resistance value depending on the change in the magnetic field caused due to conveyance of the detection target on the conveyance path surface;
a casing to enclose or hold the magnet and the magnetoresistance effect element;
a cover to cover one surface of the magnetoresistance effect element that faces the conveyance path and to form the conveyance path surface along the conveyance path; and
a signal amplification board having the signal amplification IC and disposed along the intersection surface.

2. The magnetic sensor device according to claim 1, wherein
the magnet is disposed in an orientation such that one surface of the magnet faces the conveyance path; and
the magnetoresistance effect element is disposed in an orientation such that one surface of the magnetoresistance effect element faces the conveyance path.

3. The magnetic sensor device according to claim 2, wherein
the casing is covered by a magnetic shield except for a surface of the casing that faces the conveyance path, and
the signal amplification board is fixed on an outer surface of the casing that is the intersection surface.

4. The magnetic sensor device according to claim 2, wherein the magnetoresistance effect element and the signal amplification board are connected by a flex board extending from a surface of the casing that faces the conveyance path to an outer surface of the casing that is the intersection surface.

5. The magnetic sensor device according to claim 3, wherein the signal amplification IC is disposed between the casing and the magnetic shield.

6. The magnetic sensor device according to claim 3, wherein the magnetoresistance effect element and the signal amplification board are connected by a flex board extending from a surface of the casing that faces the conveyance path to an outer surface of the casing that is the intersection surface.

7. The magnetic sensor device according to claim 5, wherein the signal amplification IC is disposed in a space secured by a spacer that is in contact with the magnetic shield and the signal amplification board.

8. The magnetic sensor device according to claim 5, wherein the magnetoresistance effect element and the signal amplification board are connected by a flex board extending from a surface of the casing that faces the conveyance path to an outer surface of the casing that is the intersection surface.

9. The magnetic sensor device according to claim 7, wherein the spacer is a screw head of a screw for fixing the signal amplification board to the casing.

10. The magnetic sensor device according to claim 7, wherein the magnetoresistance effect element and the signal amplification board are connected by a flex board extending from a surface of the casing that faces the conveyance path to an outer surface of the casing that is the intersection surface.

11. The magnetic sensor device according to claim 9, wherein the magnetoresistance effect element and the signal amplification board are connected by a flex board extending from a surface of the casing that faces the conveyance path to an outer surface of the casing that is the intersection surface.

12. The magnetic sensor device according to claim 1, wherein
the casing is covered by a magnetic shield except for a surface of the casing that faces the conveyance path, and
the signal amplification board is fixed on an outer surface of the casing that is the intersection surface.

13. The magnetic sensor device according to claim 12, wherein signal amplification IC is disposed between the casing and the magnetic shield.

14. The magnetic sensor device according to claim 12, wherein the magnetoresistance effect element and the signal amplification board are connected by a flex board extending from a surface of the casing that faces the conveyance path to an outer surface of the casing that is the intersection surface.

15. The magnetic sensor device according to claim 13, wherein the signal amplification IC is disposed in a space secured by a spacer that is in contact with the magnetic shield and the signal amplification board.

16. The magnetic sensor device according to claim 13, wherein the magnetoresistance effect element and the signal amplification board are connected by a flex board extending from a surface of the casing that faces the conveyance path to an outer surface of the casing that is the intersection surface.

17. The magnetic sensor device according to claim 15, wherein the spacer is a screw head of a screw for fixing the signal amplification board to the casing.

18. The magnetic sensor device according to claim 15, wherein the magnetoresistance effect element and the signal amplification board are connected by a flex board extending from a surface of the casing that faces the conveyance path to an outer surface of the casing that is the intersection surface.

19. The magnetic sensor device according to claim 17, wherein the magnetoresistance effect element and the signal amplification board are connected by a flex board extending from a surface of the casing that faces the conveyance path to an outer surface of the casing that is the intersection surface.

20. The magnetic sensor device according to claim 1, wherein the magnetoresistance effect element and the signal amplification board are connected by a flex board extending from a surface of the casing that faces the conveyance path to an outer surface of the casing that is the intersection surface.

* * * * *